US012783760B2

(12) United States Patent
Stahl

(10) Patent No.: US 12,783,760 B2
(45) Date of Patent: Nov. 3, 2026

(54) OPTIMIZATION OF DOSE DISTRIBUTION IN 3D PRINTING BY MEANS OF A NEURAL NETWORK

(71) Applicants: DENTSPLY SIRONA INC., York, PA (US); SIRONA DENTAL SYSTEMS GMBH, Bensheim (DE)

(72) Inventor: Christian Stahl, Darmstadt (DE)

(73) Assignee: Dentsply Sirona Inc., York, PA (US)

( * ) Notice: Subject to any disclaimer, the term of this patent is extended or adjusted under 35 U.S.C. 154(b) by 332 days.

(21) Appl. No.: 18/576,763

(22) PCT Filed: Jul. 4, 2022

(86) PCT No.: PCT/EP2022/068457
§ 371 (c)(1),
(2) Date: Jan. 5, 2024

(87) PCT Pub. No.: WO2023/280777
PCT Pub. Date: Jan. 12, 2023

(65) Prior Publication Data

US 2025/0005237 A1 Jan. 2, 2025

(30) Foreign Application Priority Data

Jul. 6, 2021 (EP) .................................... 21183874

(51) Int. Cl.
*G06F 30/27* (2020.01)
*G05B 19/4099* (2006.01)
*G06N 3/08* (2023.01)

(52) U.S. Cl.
CPC ......... *G06F 30/27* (2020.01); *G05B 19/4099* (2013.01); *G06N 3/08* (2013.01); *G05B 2219/49007* (2013.01)

(58) Field of Classification Search
CPC ..... G06F 30/27; G06F 30/20; G05B 19/4099; G05B 2219/49007; G06N 3/08;
(Continued)

(56) References Cited

U.S. PATENT DOCUMENTS 10,647,055 B2 5/2020 Wynne
2018/0141126 A1* 5/2018 Buller .................. B29C 64/153
(Continued)

FOREIGN PATENT DOCUMENTS

CN 112659548 A 4/2021
CN 117615896 2/2024
(Continued)

OTHER PUBLICATIONS

International Search Report; PCT/EP2022/068457; Sep. 27, 2022 (completed); Oct. 6, 2022 (mailed).
(Continued)

*Primary Examiner* — Zhipeng Wang
(74) *Attorney, Agent, or Firm* — SCHWEGMAN LUNDBERG & WOESSNER, P.A.

(57) ABSTRACT

A method of printing a component by using 3D printer, including: inputting a desired dose distribution in terms of the amount of UV light absorbed as a function of location within the component to be printed into a neural network by CAD/CAM software; calculation of the exposure strategy including the exposure data by means of the neural network, which optimally maps the specified desired dose distribution for the component; and printing the component with the calculated exposure data.

9 Claims, 1 Drawing Sheet

(58) Field of Classification Search
CPC ...... G06N 3/09; B29C 64/124; B29C 64/386; B33Y 10/00; B33Y 50/00; G06T 17/00
See application file for complete search history.

(56) References Cited

U.S. PATENT DOCUMENTS

| | | | | |
|---|---|---|---|---|
| 2018/0341248 | A1* | 11/2018 | Mehr | G05B 19/4099 |
| 2019/0126536 | A1* | 5/2019 | Thompson | B29C 64/264 |
| 2019/0175952 | A1 | 6/2019 | Hissoiny | |
| 2020/0103857 | A1* | 4/2020 | Wynne | G05B 19/4155 |
| 2020/0361152 | A1 | 11/2020 | Shusteff et al. | |
| 2022/0088851 | A1* | 3/2022 | Long | B29C 64/124 |

FOREIGN PATENT DOCUMENTS

| | | | |
|---|---|---|---|
| EP | 4116064 | | 12/2024 |
| JP | 2001315214 | A | 11/2001 |
| JP | 2020527475 | A | 9/2020 |
| JP | 2024522935 | | 6/2024 |
| KR | 20240029073 | | 3/2024 |
| WO | 2018217903 | A1 | 11/2018 |
| WO | 2020068499 | | 4/2020 |
| WO | 2020070136 | A1 | 4/2020 |
| WO | 2020198404 | A1 | 10/2020 |
| WO | 2023280777 | | 1/2023 |

OTHER PUBLICATIONS

Written Opinion of the International Searching Authority; PCT/EP2022/068457; Sep. 27, 2022 (completed); Oct. 6, 2022 (mailed).

"International Application Serial No. PCT EP2022 068457, International Preliminary Report on Patentability mailed Jan. 18, 2024", 10 pgs.

"Korean Application Serial No. 10-2024-7003946, Voluntary Amendment filed May 23, 2025", W English Claims, 12 pgs.

"European Application Serial No. 21183874.3, Extended European Search Report mailed Dec. 6, 2021", w o English Translation, 10 pgs.

"European Application Serial No. 21183874.3, Response filed Jul. 11, 2023 to Extended European Search Report mailed Dec. 6, 2021", w English Claims, 27 pgs.

"European Application Serial No. 21183874.3, Communication Pursuant to Article 943 EPC mailed Oct. 4, 2023", w o English Translation, 7 pgs.

"European Application Serial No. 21183874.3, Response filed Apr. 4, 2024 to Communication Pursuant to Article 943 EPC mailed Oct. 4, 2023", w English Claims, 25 pgs.

"Japanese Application Serial No. 2024-500257, Notification of Reasons for Refusal mailed Apr. 7, 2026", w/ English Translation, 9 pgs.

"Japanese Application Serial No. 2024-500257, Response filed Jun. 12, 2026 to Notification of Reasons for Refusal mailed Apr. 7, 2026", W English Claims, 8 pgs.

"Chinese Application Serial No. 202280047895.7, Office Action mailed Apr. 28, 2026", w English Translation, 22 pgs.

You, Shangting, "Mitigating Scattering Effects in Light-Based Three-Dimensional Printing Using Machine Learning", Journal of Manufacturing Science and Engineering, 142(8), (Aug. 2020).

* cited by examiner

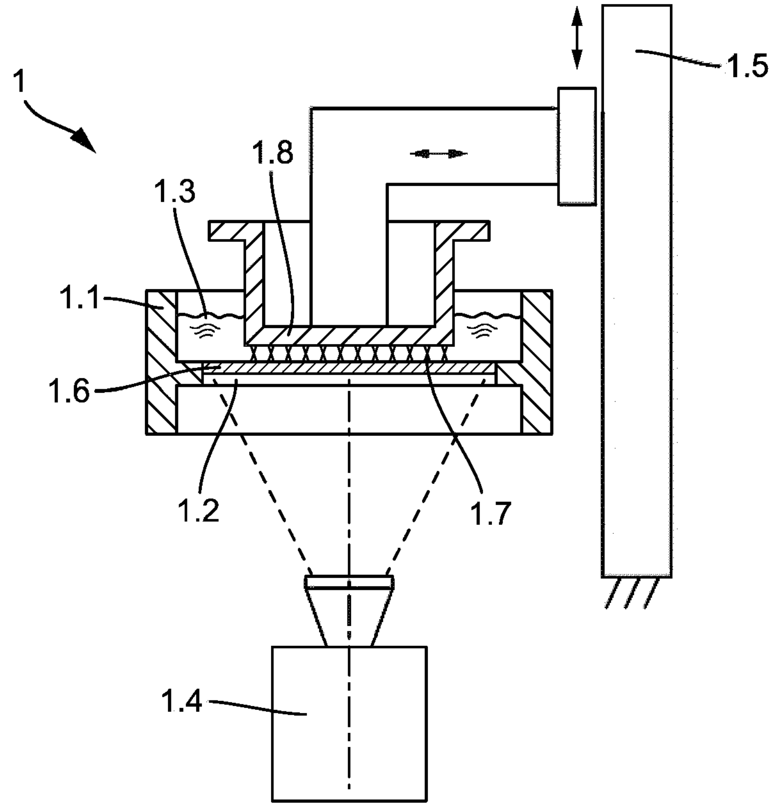
1
1.5
1.8
1.3
1.1
1.6
1.2
1.7
1.4

OPTIMIZATION OF DOSE DISTRIBUTION IN 3D PRINTING BY MEANS OF A NEURAL NETWORK

CROSS-REFERENCE TO RELATED APPLICATIONS

This is a National Phase application of International Application No. PCT/EP2022/068457, filed Jul. 4, 2022, which claims the benefit of and priority to European Application Ser. No. 21183874.3, filed on Jul. 6, 2021, which are herein incorporated by reference for all purposes.

The entire content of the priority application EP21183874 is hereby incorporated by reference to this international application under the provisions of the PCT.

TECHNICAL FIELD OF THE INVENTION

The present invention relates to additive manufacturing processes, in particular 3D printing and 3D printers.

BACKGROUND OF THE INVENTION

In 3D printing, certain processes such as SLA or DLP create a component in which photoreactive resin is cured layer by layer. In common variants of the processes, the exposure is carried out from below through a transparent bottom into a vat.

In 3D printing (here: DLP process), the photoreactive resin is solidified layer by layer through spatially selective UV irradiation. The local degree of crosslinking of the polymer material (=photoreactive resin) in the green compact (=component directly after printing) is determined by the dose distribution (=amount of absorbed UV light as a function of the location in the component).

The dose distribution can be influenced, among other things, by the choice of layer decomposition of the component geometry, the brightness distribution within the exposure masks, and the exposure times for each layer to be printed.

The local degree of crosslinking of the polymer material in the green compact determines both the accuracy of the 3D print and the mechanical properties of the printed component. Effects that influence the accuracy of the component include through-exposure (z-bleeding) and warpage due to polymerization shrinkage (also during post-exposure after the printing). The mechanical properties of the printed component, which can be influenced by the local degree of crosslinking in the green compact, among other things, are e.g. flexural strength, elongation at break, hardness. The optimization of the dose distribution or the achievement of minimum requirements in terms of accuracy and mechanical characteristics by varying the exposure strategy is classically carried out by printing jobs/tests in which the effects of individual parameter changes are monitored. The dose distribution itself is generally not an observable of the print job, but the consequences of the existing dose distribution are observed.

With the help of simulations, it is quite easy to calculate the dose distribution in the component from given exposure data of a print job (=cross-sectional views, feeds of the building platform, power densities and exposure times, i.e., the elementary process data that the 3D printer processes). The calculation in the other direction, i.e., how to achieve a desired dose distribution through the choice of exposure data, on the other hand, is much more complex.

SUMMARY OF THE INVENTION

Currently, the inventor is not aware of any prior art that can efficiently map a desired dose distribution to a specific choice of exposure data. For problems of this class (calculation in one direction trivial, in the other direction complex) the optimization by means of neural networks is suitable, because the calculations/simulations "in the easy direction" can easily generate training data for neural networks, which can solve the problem "in the difficult direction".

An objective of the present invention is to provide a method for calculating an exposure strategy to achieve a desired dose distribution using a neural network by optimizing the exposure data.

Another objective of the present invention is to provide a 3D printing system that prints the component according to the calculated exposure data.

The method according to the invention is used for printing a component by means of a 3D printer. The method comprises the following steps: Inputting a desired dose distribution in terms of the amount of UV light absorbed as a function of location within the component to be printed into a neural network by means of CAD/CAM software; Calculation of the exposure strategy including the exposure data by means of the neural network, which optimally maps the specified desired dose distribution for the component; Printing the component with the calculated exposure data.

The 3D printing system according to the invention comprises a 3D printer. The 3D printer comprises a vat having an at least partially transparent bottom for receiving liquid photoreactive resin to produce a solid component; a building platform for pulling the component out of the vat layer by layer; a projector for projecting the layer geometry onto the transparent bottom using the exposure data; a transport apparatus for at least moving the build platform downward and upward in the vat; and a control apparatus for controlling the projector and the transport apparatus.

The 3D printing system has the neural network. Alternatively, the 3D printer has a communication interface for receiving the exposure data calculated by the neural network. The control device causes printing of the component according to the calculated exposure data.

An advantageous effect of the invention is that the conventional determination of the exposure data by printing jobs/tests can be at least partially replaced or supported by the method according to the invention. This makes it possible that the determination or calculation of the exposure data can be accelerated, and better exposure strategies can be found. With improved exposure strategies, better printing results can be achieved in terms of printing speed, accuracy, and mechanical properties.

The neural network preferably receives as input the desired dose distribution determined from process development based on previous experience from printing tests/jobs.

The neural network preferably calculates the layer decomposition of the component to be printed, if in addition the digital model of the component to be printed is input to the neural network. Besides triangulations, other known representations of the digital models, such as volume models, can also be used.

The neural network can preferably be trained using training data derived from simulations/calculations in which the dose distribution in the component is calculated for given exposure data of a print job (e.g. sectional images, feeds of the building platform, power densities and exposure times, i.e. the elementary process data processed by the 3D printer).

The neural network can preferably be optimized by a measure, e.g., a score, which represents the deviation between the desired dose distribution and the dose distribution resulting from the exposure data suggested by the neural network. The printing time or speed, the mechanical characteristics, and/or the dimensional accuracy resulting from the exposure data can also preferably be included as criteria in the measure. Results can be validated in printing tests/jobs. That is, the exposure strategies determined by optimization with the neural network can be directly applied and evaluated in the print tests/jobs. Evaluation criteria can then be observables such as printing speed, dimensional accuracy and/or mechanical characteristics.

An advantageous effect of the invention is that optimized exposure strategies can be efficiently calculated by the neural network trained to determine exposure data. Thus, both the operation of the 3D printer and a particular 3D printing job can be performed optimally in terms of printing speed, accuracy and mechanical properties.

The neural network can be implemented by hardware or software. The neural network can be an integral part of the 3D printing system as hardware or software. Alternatively, the neural network may be provided separately from the 3D printing system, e.g., as a component of CAD/CAM software, and provide the calculated exposure data to the 3D printer via a communication interface. The neural network can be operated in the cloud, for example.

BRIEF DESCRIPTION OF THE DRAWING

In the following description, the present invention will be explained in more detail by means of embodiments with reference to the drawing, whereby FIG. 1—shows a schematic partial view of a 3D printer according to one embodiment of the invention.

DETAILED DESCRIPTION OF THE INVENTION

The reference numbers shown in the drawing designate the elements listed below, which are referred to in the following description of the exemplary embodiments.

1 3D Printer
1.1 Vat
1.2 Transparent bottom
1.3 Photoreactive resin
1.4 Projector
1.5 Transport apparatus
1.6 Foil
1.7 Layer
1.8 Building platform The method according to the invention is used for printing a component by means of a 3D printing system comprising a 3D printer (1) as shown in FIG. 1. First, a desired dose distribution of the component to be printed is determined. This can be done, for example, from process development based on previous experience from printing tests. In an input step, the desired dose distribution within the component to be printed is input to a neural network using CAD/CAM software. The neural network calculates an exposure strategy including exposure data that optimally maps the specified desired dose distribution for the component. The training and optimization of the neural network will be explained in more detail later in the following description. Subsequently, the calculated exposure data is provided to the 3D printing system or 3D printer (1). The 3D printer (1) prints the component with the calculated exposure data.

As shown in FIG. 1 shown, the 3D printer (1) comprises a vat (1.1) having an at least partially transparent bottom (1.2) for receiving liquid photoreactive resin (1.3) for producing a solid component; a building platform (1.8) for pulling the component out of the vat (1.1) layer by layer; a projector (1.4) for projecting the layer geometry onto the transparent bottom (1.2); a transport apparatus (1.5) for at least moving the building platform (1.8) downward and upward in the vat (1.1); and a control device for controlling the projector (1.4) and the transport apparatus (1.5). The control device causes the component to be printed according to the calculated exposure data.

The neural network is preferably implemented as software. The software is provided on a computer-readable storage medium. The software has a computer-readable code that can be executed on a computing unit or computer. The computing unit or computer is preferably part of the 3D printing system, and is connected or connectable to the 3D printer. Alternatively, the neural network software may be provided separately from the 3D printing system. This can be run locally on a computer or the cloud. The 3D printing system can be connected to the computer or the cloud via a communication interface. Alternatively, the neural network can be implemented as hardware in a device. Preferably, the device is part of the 3D printing system. However, the device may also be provided separately from the 3D printing system. The 3D printing system may be connected to the neural network hardware via the communication interface. Input to the neural network and transmission of exposure data may be provided via the communication interface. The communication interface may have a wired or wireless connection. The 3D printing system preferably has CAD/CAM software for creating print jobs. This can also be operated on a separate computer. The conventional calculation of the exposure strategy can be completely or at least partially replaced or supported by the neural network. In a further preferred embodiment, the layer decomposition can also be left to the neural network. The input layer of the neural network would then be, for example, the 3D model of the component to be printed in the form of a triangulation. In addition, the neural network can preferably calculate the layer decomposition of the component to be printed when the triangulation of the component to be printed is input to the neural network.

Training Data and Training the Neural Network

With the help of calculations/simulations, it becomes quite easy to calculate the dose distribution in the component from given exposure data of a print job (=cross-sectional images, feeds of the building platform, power densities and exposure times, i.e. the elementary process data that the 3D printer (1) processes). These calculations/simulations can be easily generated and used as training data for a neural network. In one embodiment, the neural network is trained using training data obtained from simulations, where in each simulation the dose distribution in the component was calculated for predetermined exposure data of a print job including the process data to be processed by the 3D printer (1). Training data can be made available via a cloud/storage for training neural networks connected to the network.

Results can be validated in print tests. This means that the exposure strategies determined by optimization with the neural network can be directly applied and evaluated in the print test. Evaluation criteria can then be observables such as printing speed, dimensional accuracy and mechanical characteristics. The evaluation of an output from the output layer of the neural network is performed e.g. by generating a simulation of the printing result (incl. geometry and dose distribution) from the output. This simulation result is compared with the target geometry and the desired or preferred dose distribution. A measure (score) is calculated from the deviations. As a measure for training, for example, the deviation between desired dose distribution and the dose distribution resulting from the exposure data suggested by the neural network can serve for optimization. In further preferred embodiments, one or more of the following characteristic values: print time or print speed of the print job, the mechanical characteristics and the dimensional accuracy of the component resulting from the exposure data proposed by the neural network, may also be included as criteria in the measure for optimization.

The invention claimed is:

1. A method of printing a component using a 3D printer comprising:

inputting into a neural network using a CAD/CAM software a desired dose distribution in terms of an amount of UV light absorbed as a function of location within the component to be printed, wherein the neural network is trained using training data obtained from simulations, wherein in each simulation a dose distribution in a simulated component was calculated for a given exposure data of a print job containing process data to be processed by the 3D printer;

calculating an exposure strategy including an exposure data using the neural network, which optimally maps the desired dose distribution for the component; and printing the component with the exposure data.

2. The method according to claim 1, wherein, during training of the neural network, a deviation between the desired dose distribution and another dose distribution resulting from the exposure data suggested by the neural network is also included as a criterion in a measure for optimization.

3. The method according to claim 1, wherein, during training of the neural network, a printing time or a printing speed resulting from the exposure data suggested by the neural network is also included as a criterion in a measure for optimization.

4. The method according to claim 1, wherein, during training of the neural network, mechanical characteristic values resulting from the exposure data suggested by the neural network are also included as a criterion in a measure for optimization.

5. The method according to claim 1, wherein, when training the neural network, a dimensional accuracy resulting from the exposure data suggested by the neural network is also included as a criterion in a measure for optimization.

6. The method according to claim 1, wherein, additionally, a triangulation of the component to be printed is input into the neural network, and the neural network calculates a layer decomposition of the component to be printed.

7. The method according to claim 1, wherein the neural network is implemented by hardware or software, the software comprising computer-readable code which, when executed on a computing unit connected or connectable to the 3D printer, causes the 3D printer to print the component according to the exposure data.

8. A non-transitory computer-readable storage medium storing a program, comprising instructions which when executed by a computer connected to a 3D printer, causes the computer to:

input, into a neural network using a CAD/CAM software, a desired dose distribution in terms of an amount of UV light absorbed as a function of location within a component to be printed, wherein the neural network is trained using training data obtained from simulations, wherein in each simulation a dose distribution in a simulated component was calculated for a given exposure data of a print job containing process data to be processed by the 3D printer;

calculate an exposure strategy including an exposure data using the neural network, which optimally maps the desired dose distribution for the component; and print the component with the exposure data.

9. A 3D printing system comprising a 3D printer, wherein the 3D printer comprises:

a vat having an at least partially transparent bottom for receiving liquid photoreactive resin for producing a solid component;

a building platform for pulling the solid component out of the vat layer-by-layer;

a projector for projecting layer geometry onto the at least partially transparent bottom;

a transport apparatus for at least moving the building platform down and up in the vat; and a control device for controlling the projector and the transport apparatus;

wherein the control device uses an exposure strategy including an exposure data that is calculated using a neural network, which optimally maps a desired dose distribution for the solid component, wherein the neural network is trained using training data obtained from simulations, wherein in each simulation a dose distribution in a simulated component was calculated for a given exposure data of a print job containing process data to be processed by the 3D printer;

wherein the control device causes printing of the solid component according to the exposure data.

* * * * *